(12) United States Patent  (10) Patent No.: US 7,471,231 B2
Ang et al.  (45) Date of Patent: Dec. 30, 2008

(54) COLUMN PARALLEL READOUT WITH A DIFFERENTIAL SLOPED A/D CONVERTER

(75) Inventors: Lin Ping Ang, Chino Hills, CA (US); Daniel Van Blerkom, Altadena, CA (US)

(73) Assignee: Forza Silicon Corporation, Pasadena, CA (US)

( * ) Notice: Subject to any disclaimer, the term of this patent is extended or adjusted under 35 U.S.C. 154(b) by 0 days.

(21) Appl. No.: 11/739,619

(22) Filed: Apr. 24, 2007

(65) Prior Publication Data

US 2008/0266155 A1  Oct. 30, 2008

(51) Int. Cl.
*H03M 1/56* (2006.01)

(52) U.S. Cl. .................................. 341/169; 341/155

(58) Field of Classification Search .................. 341/155, 341/169; 348/121
See application file for complete search history.

(56) References Cited

U.S. PATENT DOCUMENTS

| | | | |
|---|---|---|---|
| 6,229,134 B1 | 5/2001 | Ang et al. | |
| 6,295,013 B1 | 9/2001 | Barna et al. | |
| 6,365,886 B1 | 4/2002 | Ang et al. | |
| 6,388,241 B1 | 5/2002 | Ang | |
| 6,423,957 B1* | 7/2002 | Kim et al. ................ 250/208.1 | |
| 6,441,357 B2 | 8/2002 | Ang et al. | |
| 6,507,011 B2 | 1/2003 | Ang | |
| 6,545,624 B2* | 4/2003 | Lee et al. ..................... 341/155 | |
| 6,567,028 B2 | 5/2003 | Huang et al. | |
| 6,629,172 B1 | 9/2003 | Andersson et al. | |
| 6,847,399 B1 | 1/2005 | Ang | |
| 6,870,565 B1 | 3/2005 | Blerkom et al. | |
| 6,881,942 B2 | 4/2005 | Huang et al. | |
| 6,937,278 B2 | 8/2005 | Huang et al. | |
| 6,977,603 B1 | 12/2005 | Barna et al. | |
| 7,075,474 B2* | 7/2006 | Yamagata et al. ........... 341/169 | |
| 7,084,914 B2 | 8/2006 | Van Blerkom | |
| 7,345,613 B2* | 3/2008 | Higuchi ..................... 341/155 | |
| 2001/0017343 A1 | 8/2001 | Ang et al. | |
| 2002/0134917 A1 | 9/2002 | Ang | |
| 2002/0139921 A1 | 10/2002 | Huang et al. | |
| 2002/0140689 A1 | 10/2002 | Huang et al. | |
| 2003/0062582 A1 | 4/2003 | Blerkom | |
| 2003/0071748 A1 | 4/2003 | Huang et al. | |
| 2004/0021787 A1* | 2/2004 | Cho .......................... 348/308 | |

* cited by examiner

*Primary Examiner*—Brian Young
(74) *Attorney, Agent, or Firm*—Law Office SC Harris

(57) ABSTRACT

A dual slope A/D converter uses two opposite sense ramps added to its differential input. The value in a digital counter is latched at the time when the two ramps intersect. This enables a more consistent switching point, allowing the amplifier to the linear over a larger part of its range.

22 Claims, 3 Drawing Sheets

COLUMN PARALLEL READOUT WITH A DIFFERENTIAL SLOPED A/D CONVERTER

BACKGROUND

Sloped A/D converters have been used in the prior art. A sloped A/D converter may operate in conjunction with a constant current being applied to a capacitor, thereby causing the voltage on the capacitor to continually increase (or decrease). A constant voltage source may be connected across a resistance to set the constant current.

A continually running clock drives a counter that is indicative of the digital value related to the voltage on the capacitor at any time. The counter value is latched at the time that a comparator senses that the ramp value is the same as the sample value. This count represents a digital count of the analog voltage being sampled.

Sloped A/D converters include many advantages including noise independence, simple calibration, and a simple structure.

Other flavors of sloped A/D converters exist, including dual slope A/D converters which integrate both the signal and the reference, in order to increase the accuracy of the system. A ramp-compare ADC (also called integrating, dual-slope or multi-slope ADC) produces a saw-tooth signal that ramps up, then quickly falls to zero. When the ramp starts, a timer starts counting. When the ramp voltage matches the input, a comparator fires, which causes the timer's value to be recorded.

SUMMARY

The present application teaches a sloped A/D converter which uses two opposite sense sloped ramps.

Advantages of different embodiments include a more consistent switching point and consequent better linearity.

According to one aspect, further noise immunity, and improved settling time may be possible. Another aspect defines use in an image sensor.

BRIEF DESCRIPTION OF THE DRAWINGS

These and other aspects will now be described in detail with reference to the accompanying drawings, wherein.

DETAILED DESCRIPTION

Figure 1:
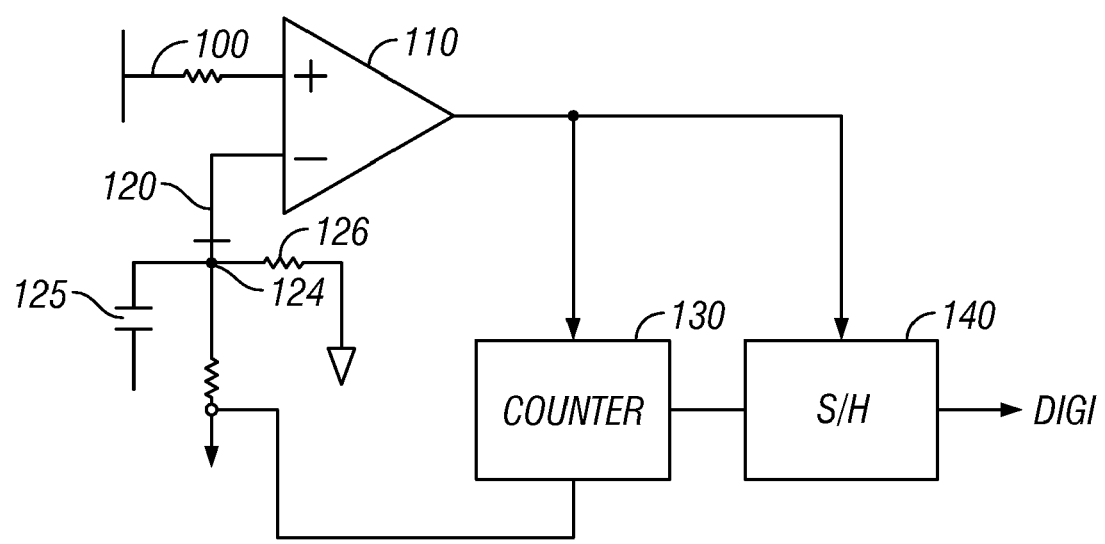
FIG. 1 shows an exemplary sloped A/D converter.

FIG. 1 illustrates an exemplary sloped converter. A signal 100 is applied to one input of an amplifier, here a comparator 110. The other input of comparator 110 receives a constant current, e.g. accumulated by a capacitor 120, through for example a resistive divider 126. A counter 130 begins a digital count at the time that the node 124 connected to the capacitor 124 and resistive divider 126 begins accumulating value.

When the value on the node 124 becomes equal to the sample value 100, the output of the comparator 110 switches. This change in value signals a sample and hold circuit 140 to latch the digital value from counter 130 as a value representing the value of the signal.

The inventors recognized a problem with a system that values continually integrate in the amplifier. Switching points of the amplifier are different for different input values. The comparator/amplifier 110 needs to be capable of switching anywhere within its entire range. Hence, any nonlinearity in the amplifier/comparator 110 may cause a nonlinearity in the output signal. Since the switching point can vary over that entire range, any nonlinearities can become problematic.

In addition, the value of the capacitor 125 is left in a charged state that could be any value. Reducing this value to a reset value (e.g., either zero or Vcc) requires a settling time which can in turn affect the overall conversion time of the circuit.

It is difficult and hence expensive to make a comparator which has a relatively wide range of conversion. It is similarly difficult and expensive to make a comparator that is linear across such a wide range.

Figure 2:
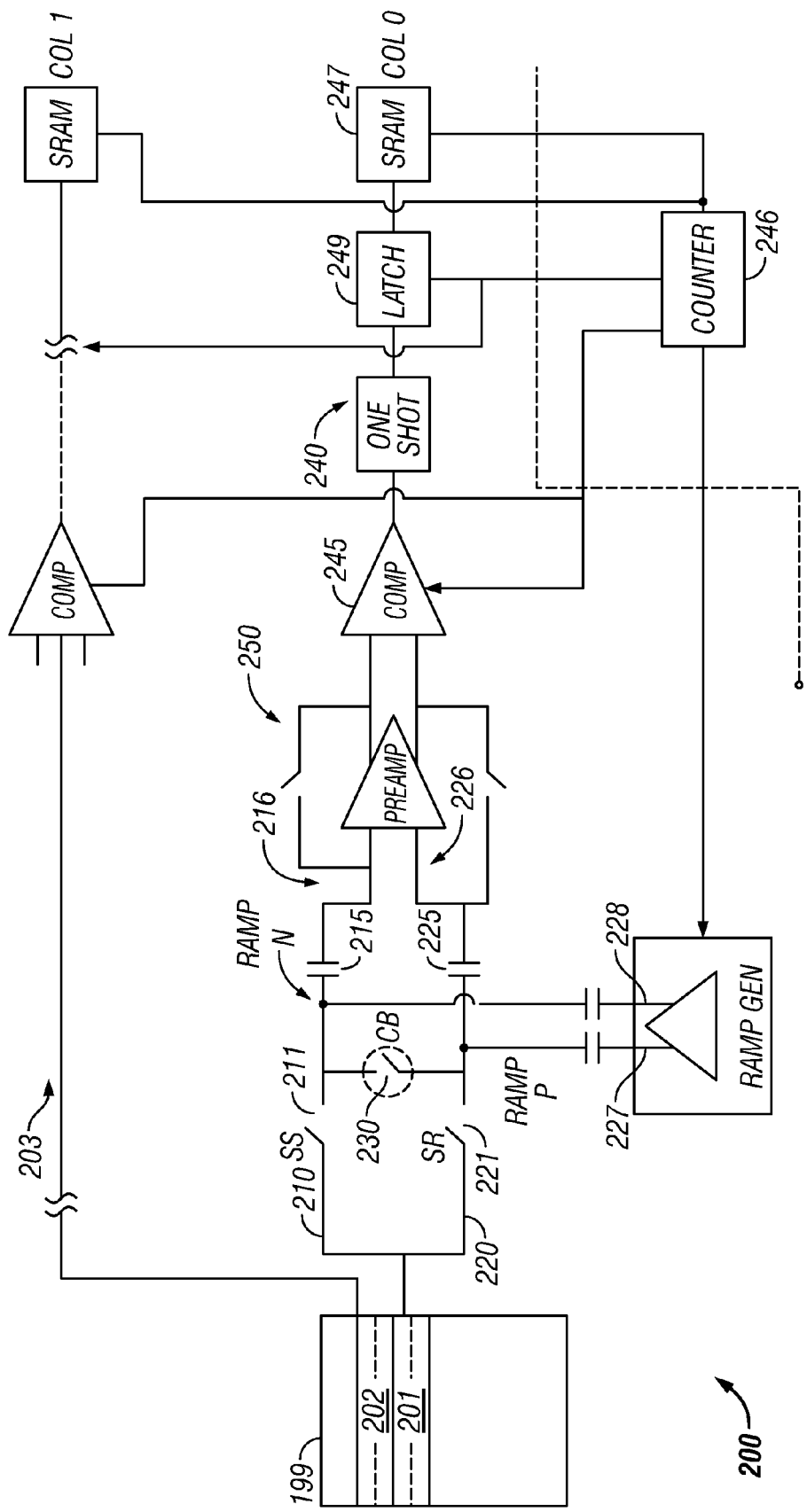
FIG. 2 shows an embodiment.

An embodiment which addresses this issue is shown in FIG. 2. The embodiment is usable, for example, in an image sensor, for example an active pixel sensor. This embodiment may be used with other sensors, and in fact may be used with any application that requires A/D conversion.

The circuit 200 is intended for use as a column parallel read out. In such an arrangement, the circuit 200 is associated with columns in an active pixel sensor 199 whose output is being sensed. The operation proceeds as follows.

A first column 201 is associated with the circuit 200. Different columns such as 202 are associated with other circuits, such as 203.

In circuit 200, a sample signal chain 210 includes a switch 211 which is closed to sample the signal value of a specified pixel. When closed, the value of the signal is sampled onto the capacitor 215. Similarly, the reset chain 220 has a switch 221 which is closed to sample the reset value onto the capacitor 225.

After both signal and reset have been sampled onto the appropriate capacitors 215, 225 respectively, a switch 230 is closed. This switch shorts together the two signals, producing a summed value of (signal+reset)/2 on one plate of the capacitors 215, 225.

The capacitive coupling effect of the capacitors 215, 225, changes the values 216, 226 that are present on the other plates of the capacitors 215, 225. This causes a differential value, that is applied to a differential preamp 250. The preamp 250 is configured into a high gain amplifier, so that it 'rails' to either full on or full off, depending on which of its input value is higher.

Figure 3A:
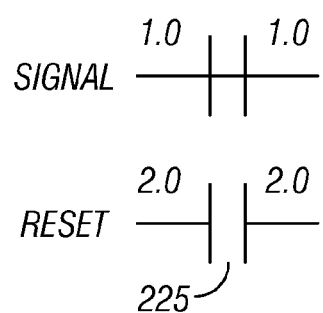
FIGS. 3A-3B show exemplary parts of the circuit and some exemplary voltages.

Some example values may help to clarify the operation. An exemplary sample value set is shown in FIG. 3A. The signal may have a value of 1.0, produced by the signal value from the active pixel sensor's pixel. The reset value may have a value of 2.0 volts, in this example. This example also assumes that the inputs to the preamplifier/comparator 250 are a virtual ground, although that can also be modified in different embodiments. For example, the inputs to preamp 250 may be at a virtual +1 volts.

Figure 3B:
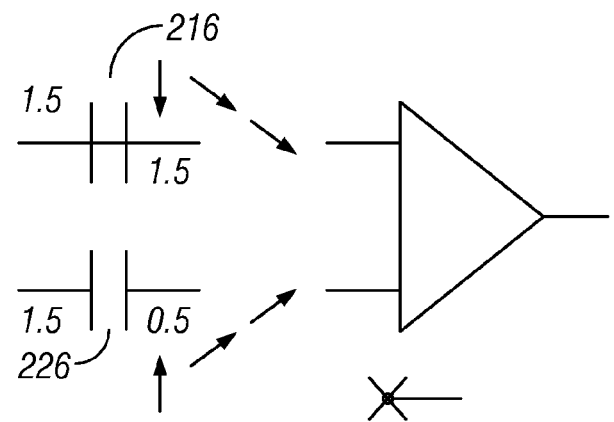

The switch 230 is closed momentarily, which causes the voltages to change as shown in FIG. 3B. The capacitors will draw or source current by whatever is necessary to oppose any change across the capacitor. Accordingly, FIG. 3B shows how the values across the capacitors have changed. The two values at the switch side of the capacitors have been averaged by the switch's action to 1.5 v. The opposite side of the capacitors have changed. Signal branch plate 216 has changed to 1.5 v. The reset branch plate 226 of the capacitor has changed to +0.5 volts. Hence, the preamp 250 has inputs of 1.5 volts on the signal side; +0.5 volts on the reset side. The preamp 250 rails to its maximum output.

The output of the preamp 250 is applied to glue logic module 240 which operates to determine the digital value as described herein.

After closing the switch 230, two differential, opposite sense voltage ramps are applied to the respective signal and reset chains. A negative going ramp 228 is added to the signal chain 210. A positive going ramp 227 is added to the reset chain 220. The ramp adds to the values—bringing the signal value down and at the same time bringing the reset value up. Using the example above—the 1.5 volt input to the preamp 230 is reduced by the ramp from 228. At the same time, the +0.5 v input to the preamp is increased by the ramp from 227. In the embodiment, the opposite ramps are created differentially by the same unit, and from the same clock signal (here the counter).

The two ramps eventually meet halfway between the signal and reset value. This produces a reversal in the output of the preamp 250, which therefore rails to its negative most value.

A logic module assembly 240 is formed of a latching comparator 245, and an SRAM 247. The comparator is clocked by the same clock that drives the ramp generator and the counter. At the same time, the counter output is also output to SRAM 247. The counter speed is synchronized to the slope of the differential ramps 227,228.

When the slopes of the ramps 227,228 cross, the preamp 250 changes state, and triggers the comparator. The comparator triggers the SRAM to store the current value of the counter at that time when the ramps have crossed.

The opposite sense ramps allow reduction of the necessary switching range of the preamp 250, which, for example, may be reduced to a relatively small range.

In addition, the switching point of the preamp will be consistent at (signal-reset), and this value will not change much from pixel to pixel. Hence, any nonlinearity effects of the preamp may be minimized.

The general structure and techniques, and more specific embodiments which can be used to effect different ways of carrying out the more general goals are described herein.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, the preamps and comparators may be formed using different structures. Different voltages and opposite senses may be used. While this is intended for use in a column parallel active pixel sensor readout, other embodiments may use this system in other readout systems for other arrangements of image sensors and for other applications.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims.

The active pixel sensor may be controlled by a control device, which may be a conventional controller for an image sensor, or may be a computer, e.g., an Intel (e.g., Pentium or Core 2 duo) or AMD based computer, running Windows XP or Linux, or may be a Macintosh computer. The computer may also be a handheld computer, such as a PDA, cellphone, or laptop. The programs to run the computer may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned.

What is claimed is:

1. An analog to digital converter system, comprising:
   a signal sampling line;
   a reset sampling line; a ramping circuit, creating a first ramp that changes value between a first voltage value and a second voltage value, in a first direction and creating a second ramp that changes value in an opposite direction to said first ramp, and coupled to said reset sampling line; and
   a logic element, creating a digital value based on a difference between said signal and reset values and based on an intersection between said first and second ramping portions.

2. A system as in claim 1, further comprising a connection to an array of image sensing pixels.

3. A system as in claim 2, further comprising a plurality of A/D converting parts, one associated with each pixel in a column of pixels of said image sensing pixels, and collectively capable of converting an entire column of pixels at any given time.

4. A system as in claim 1, further comprising a counting clock, and wherein said ramping circuit is a differential ramp creating circuit, wherein said first ramping portion and said second ramping portion are produced differentially by the differential ramp creating circuit based on a same counting clock.

5. A system as in claim 1, wherein said logic element creates said digital value at a time when said first and second ramping portions intersect.

6. A system as in claim 5, wherein said logic element includes at least one amplifier which is linear only over a specified portion of its overall range.

7. A system as in claim 1, further comprising a counter, which maintains a digital count that is used to create said digital value.

8. A system as in claim 7, wherein said ramping circuit is connected to receive said counter, and wherein said counter is also used as timing for create said first and second ramping portions.

9. A system as in claim 8, wherein said first and second ramping portions are each differentially created by the same structure.

10. A system as in claim 1, further comprising a signal capacitor associated with said signal sampling line, a reset capacitor associated with said reset sampling line, and a crowbar which shorts together one side of each of said signal and reset capacitors.

11. An image sensor system, comprising:
    an array of image sensor pixels;
    a readout system for said image sensor pixels, including a plurality of sampling systems, each of said sampling systems including:
    a signal sampling part;
    a reset sampling part;
    a switch, which connects together said signal sampling part and said reset sampling part;
    a ramping portion, which creates a first ramp going in a positive direction, connected to one of said sampling parts and creates a second ramp going in a negative direction, connected to the other of said sampling parts;

a counter, that maintains a digital count indicative of a digital value; and a detection portion, that latches a value of said digital count when said first and second ramps intersect.

12. An image sensor system as in claim 11, wherein said detection portion includes an amplifier that is linear over only a portion of its entire range.

13. An image sensor system as in claim 11, wherein said detection portion includes a comparator that is linear over only a portion of its entire range.

14. An image sensor system as in claim 11, further comprising a single ramp generator, that differentially creates said both said first and second ramping portions.

15. An image sensor system as in claim 14, wherein said ramp generator is driven by said counter.

16. An image sensor system as in claim 11, wherein said readout system for said image sensor pixels includes a plurality of separate readout circuits, one associated with each pixel of each column of said image sensor array, enabling readout in parallel of digital values representing each pixel of the column.

17. An A/D converter, comprising:

an amplifier circuit, connected in a differential arrangement, receiving a first value to be A/D converted at a first input of said differential arrangement and receiving another value related to said first value, and a second input of said differential arrangement;

a ramp circuit, producing an output indicative of a positive going ramp coupled to one of said inputs, and producing a value of the negative going ramp coupled to another of said inputs, said ramp circuit connected in a way that sums with said first and second values; and a logic circuit, producing an output from said amplifier circuit, including a counter circuit that produces an output indicative of a digital value, and establishes said output from said counter circuit at a time based on said output from said amplifier circuit.

18. An A/D converter as in claim 17, wherein said amplifier circuit includes a comparator.

19. An A/D converter as in claim 17, further comprising an image sensor circuit, producing outputs indicative of values from image sensor pixels.

20. An A/D converter as in claim 19, wherein said first value represents a signal value of one of said image sensor pixels, and said second value represents a reset value of said one of said image sensor pixels.

21. An A/D converter as in claim 17, wherein said ramp circuit is driven by said counter.

22. An A/D converter as in claim 21, wherein said ramp circuit differentially creates said positive going ramp and said negative going ramp as differential copies of one another.

* * * * *